United States Patent
Defay et al.

(10) Patent No.: US 12,382,835 B2
(45) Date of Patent: Aug. 5, 2025

(54) PASSIVATED TRANSPARENT PIEZOELECTRIC DEVICE WITH HIGH TRANSPARENCY AND HIGH BREAKDOWN VOLTAGE

(71) Applicant: LUXEMBOURG INSTITUTE OF SCIENCE AND TECHNOLOGY (LIST), Esch-sur-Alzette (LU)

(72) Inventors: Emmanuel Defay, Esch-sur-Alzette (LU); Stéphanie Girod, Esch-sur-Alzette (LU); Sebastjan Glinsek, Esch-sur-Alzette (LU); Aymen Mahjoub, Esch-sur-Alzette (LU)

(73) Assignee: Luxembourg Institute of Science & Technology (LIST), Luxembourg (LU)

( * ) Notice: Subject to any disclaimer, the term of this patent is extended or adjusted under 35 U.S.C. 154(b) by 593 days.

(21) Appl. No.: 17/795,055

(22) PCT Filed: Jan. 22, 2021

(86) PCT No.: PCT/EP2021/051495
§ 371 (c)(1),
(2) Date: Jul. 25, 2022

(87) PCT Pub. No.: WO2021/148630
PCT Pub. Date: Jul. 29, 2021

(65) Prior Publication Data
US 2023/0077545 A1    Mar. 16, 2023

(30) Foreign Application Priority Data
Jan. 23, 2020    (LU) ........................... 101605

(51) Int. Cl.
*H10N 30/00*    (2023.01)
*H10N 30/06*    (2023.01)
(Continued)

(52) U.S. Cl.
CPC ........... *H10N 30/708* (2024.05); *H10N 30/06* (2023.02); *H10N 30/077* (2023.02); *H10N 30/853* (2023.02); *H10N 30/878* (2023.02)

(58) Field of Classification Search
CPC .. H10N 30/708; H10N 30/077; H10N 30/853; H10N 30/878; H10N 30/078;
(Continued)

(56) References Cited

U.S. PATENT DOCUMENTS 5,814,918 A * 9/1998 Nakahata ........... H03H 9/02582
310/313 R
9,097,925 B2 * 8/2015 Yokoyama ........ G02F 1/133345
(Continued)

FOREIGN PATENT DOCUMENTS

| CN | 105185898 A | 12/2015 |
|---|---|---|
| WO | 2015053345 A1 | 4/2015 |
| WO | 2017202652 A1 | 11/2017 |

OTHER PUBLICATIONS

International Search Report for PCT/EP2021/051495 mailed Apr. 8, 2021.
Written Opinion for PCT/EP2021/051495 mailed Apr. 8, 2021.

*Primary Examiner* — Donghai D Nguyen
(74) *Attorney, Agent, or Firm* — Sandberg Phoenix & von Gontard PC; Scott T. Gray

(57) ABSTRACT

A piezoelectric device comprising a transparent substrate; a transparent barrier layer on the substrate; a transparent piezoelectric layer on the transparent barrier layer; a transparent layer of interdigitated electrodes on the transparent piezoelectric layer; wherein the piezoelectric device further comprises a transparent dielectric layer at least on the portion of piezoelectric layer that is between successive fingers of the transparent layer of interdigitated electrodes, the transparent dielectric layer having a refractive index lower than a refractive index of the transparent layer of
(Continued)

Figure 1:
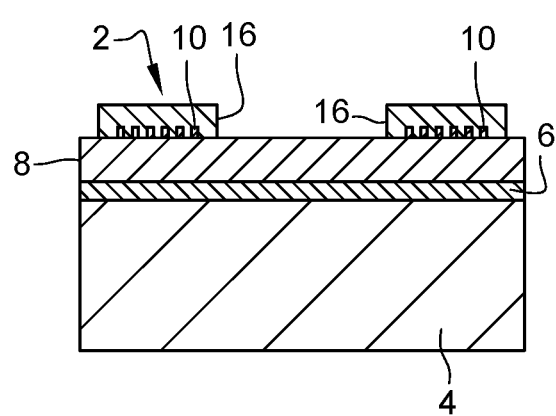

interdigitated electrodes and a dielectric strength superior to 3 MV/m.

17 Claims, 3 Drawing Sheets

(51) Int. Cl.
*H10N 30/077* (2023.01)
*H10N 30/853* (2023.01)
*H10N 30/87* (2023.01)

(58) Field of Classification Search
CPC .............. Y10T 29/42; Y10T 29/49005; H03H 9/02582; G02F 1/133345
See application file for complete search history.

(56) References Cited

U.S. PATENT DOCUMENTS

2013/0027340 A1    1/2013   Kodani et al.
2019/0296216 A1*   9/2019   Sette ..................... H10N 30/06

* cited by examiner

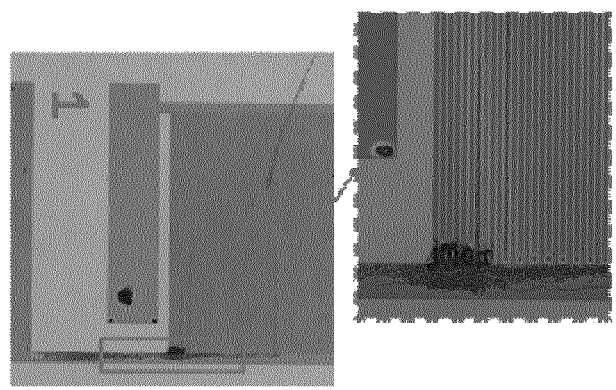
Fig. 4
Fig. 5
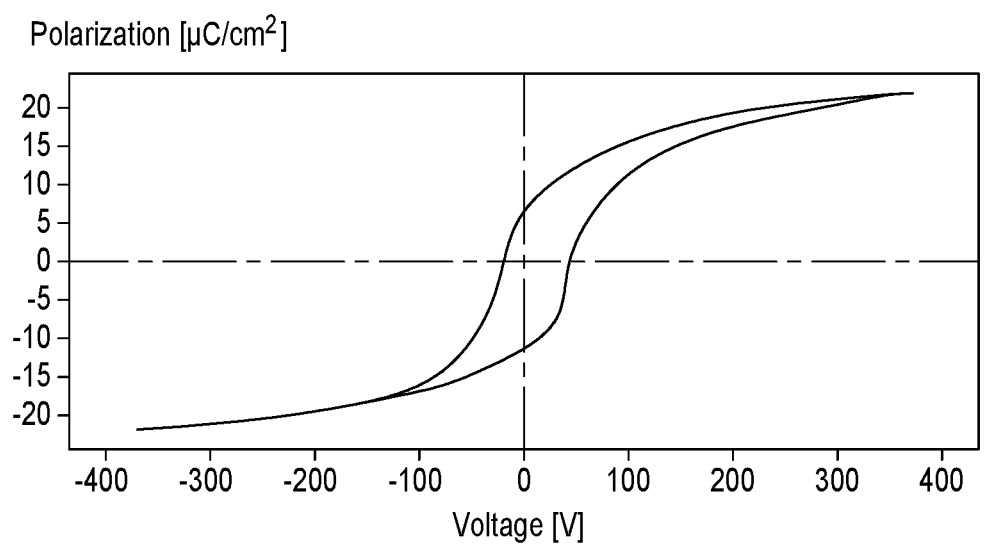
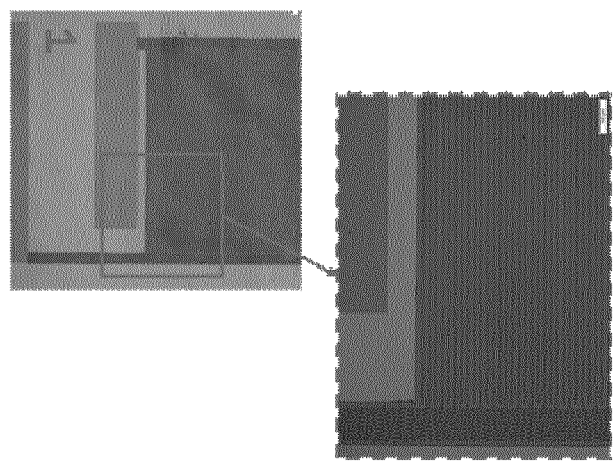
Fig. 6

PASSIVATED TRANSPARENT PIEZOELECTRIC DEVICE WITH HIGH TRANSPARENCY AND HIGH BREAKDOWN VOLTAGE

CROSS-REFERENCE TO RELATED APPLICATIONS

The present invention is the US national stage under 35 U.S.C. § 371 of International Application No. PCT/EP2021/051495 which was filed on Jan. 22, 2021, and which claims the priority of application LU 101506 filed on Jan. 23, 2020 the contents of which (text, drawings and claims) are incorporated here by reference in its entirety.

FIELD

The invention is directed to a piezoelectric device, more particularly to a transparent piezoelectric device.

BACKGROUND

Transparent piezoelectric devices like actuators are used in many applications such as in haptic device (displays).

Transparent interdigitated actuator based on piezoelectric thin films and without passivation layer shows low-voltage dielectric breakdown. The actuators show reliability issues at high driving voltage due to breakdown that primarily occurs through air. The actuator is therefore damaged after application of high voltage. The actuators also show large Fabry-Perot oscillations in transmittance spectra, which decrease their transparency in the visible spectrum. Therefore, there is a need to provide a piezoelectric device that has a high breakdown voltage while maintaining a high transparency of the device in the visible wavelength range.

Prior art patent published WO2017/202652 A1 discloses a transparent piezoelectric device comprising a transparent substrate, a transparent dielectric barrier layer on the substrate and a transparent piezoelectric layer on the barrier. A transparent layer of interdigitated electrodes covers the transparent piezoelectric layer. That transparent piezoelectric device fails to have a high breakdown voltage.

Prior art PhD thesis published "Internal electric fields and electrode effect in ferroelectric thin films for piezoelectric energy harvesting", Robin Nigon, 2017, discloses a piezoelectric device comprising a non-transparent substrate (silicon) on which is deposited a piezoelectric layer. The piezoelectric layer is covered by interdigitated electrodes. A top additional layer of $SiO_2$ is added on the interdigitated electrodes. That piezoelectric device fails to be optically transparent.

Prior art document published by Park et al. discloses a piezoelectric device. The piezoelectric device comprises a plastic substrate on which is deposited a PZT thin film and interdigitated electrodes are deposited on the piezoelectric thin film. A SU-8 epoxy layer covers the device and is deposited by a photolithography method to encapsulate the device. However, as visible in FIG. 1 of that document, the piezoelectric device is not optically transparent.

SUMMARY

The invention has for technical problem to provide a thin-film piezoelectric device having a high breakdown voltage. More particularly, the invention has for technical problem to provide a thin-film piezoelectric device having a high optical transparency.

The invention is directed to a piezoelectric device comprising: a transparent substrate; a transparent piezoelectric layer on the transparent substrate; a transparent layer of interdigitated electrodes on the transparent piezoelectric layer; wherein the piezoelectric device further comprises a transparent dielectric layer directly on the transparent piezoelectric layer, between the interdigitated electrodes, and having a dielectric strength greater than 3 MV/m.

According to an exemplary embodiment, each electrode of the interdigitated electrodes comprises portions adjacent to corresponding portions of another electrode of the interdigitated electrodes, so as to form gaps between the portions and corresponding portions, the transparent dielectric layer extending between and bridging the gaps.

According to an exemplary embodiment, the transparent dielectric layer shows an average thickness between the interdigitated electrodes that is at least 80% of an average thickness of the interdigitated electrodes.

According to an exemplary embodiment, the transparent dielectric layer has a refractive index, in a wavelength range from 400 nm to 700 nm, that is lower, within the wavelength range, than a refractive index in the wavelength range of the transparent piezoelectric layer.

According to an exemplary embodiment, the transparent dielectric layer covers the transparent conductive layer of interdigitated electrodes.

According to an exemplary embodiment, the transparent dielectric layer has a refractive index, in a wavelength range from 400 nm to 700 nm, that is lower, within the wavelength range, than a refractive index in the wavelength range of the transparent conductive layer of interdigitated electrodes.

According to an exemplary embodiment, the refractive index of the transparent conductive layer of interdigitated electrodes is lower, over the wavelength range, than a refractive index in the wavelength range of the transparent piezoelectric layer.

Advantageously, the refractive index of the transparent dielectric layer, over the wavelength range, is less than 2, in various instances less than 1.8, and/or greater than 1.4, for example greater than 1.5.

Advantageously, the refractive index of the transparent layer of interdigitated electrodes, over the wavelength range, is less than 2.4, in various instances less than 2.3, and/or greater than 1.8, for example greater than 1.9.

Advantageously, the dielectric strength of the transparent dielectric layer is greater than 50 MV/m, in various instances greater than 100 MV/m, for example greater than 400 MV/m.

Advantageously, a transparent barrier layer is applied between the transparent substrate and the transparent piezoelectric layer.

Advantageously, the refractive index of the transparent piezoelectric layer, over the wavelength range, is less than 2.6, in various instances less than 2.5, and/or greater than 2.2, for example greater than 2.3.

According to an exemplary embodiment, the transparent dielectric layer has a thickness less than 5 μm and/or greater than 0.2 μm, in various instances equals to 1 μm.

According to an exemplary embodiment, the transparent dielectric layer consists of a material selected from: bisphenol A novolac epoxy, silicon dioxide, silicon nitride, $SiO_xN_y$, alumina, hafnia, zirconia.

According to an exemplary embodiment, the transparent layer of interdigitated electrodes comprises two coplanar sets of interdigitated electrodes, each set having two electrodes, each electrode having a plurality of fingers which are interdigitated.

According to an exemplary embodiment, the piezoelectric device further comprises pads, each pad being connected to an electrode of the transparent layer of interdigitated electrodes, the pads being free of the transparent dielectric layer.

According to an exemplary embodiment, the transparent layer of interdigitated electrodes consists of a conductive transparent materiel oxide.

According to an exemplary embodiment, the conductive transparent materiel oxide is indium tin oxide or fluoride tin oxide or aluminium doped zinc oxide or Ga—In—Sn—O, or Zn—In—Sn—O, or Ga—In—O, or Zn—In—O.

According to an exemplary embodiment, the transparent barrier layer consists of one of: $TiO_2$, $HfO_2$, $ZrO_2$.

According to an exemplary embodiment, the transparent piezoelectric layer is made of $Pb(Zr,Ti)O_3$ (PZT), $(K,Na)NbO_3$, $(Ba,Cr)(Zr,Ti)O_3$, $(Bi_{0.5}Na_{0.5})TiO3$-$BaTiO_3$, Aluminium Nitride, Sc-doped aluminium nitride, $BiFeO_3$, La doped-$BiFeO_3$, Mn-doped $BiFeO_3$ or any combination thereof.

According to an exemplary embodiment, the transparent piezoelectric layer has a surface representing 100% of the surface of the transparent substrate.

The invention is also directed to a method for fabricating a transparent piezoelectric device, comprising the following steps: providing a transparent substrate; depositing a transparent piezoelectric layer on the transparent substrate; depositing a transparent layer of interdigitated electrodes on the transparent piezoelectric layer; wherein the method further comprises a step of depositing a transparent dielectric layer directly on the transparent piezoelectric layer, between and contacting the interdigitated electrodes, and having a dielectric strength superior to 3 MV/m.

According to an exemplary embodiment, the transparent piezoelectric device is in accordance with the invention.

According to an exemplary embodiment, the step of depositing the transparent dielectric layer on the transparent piezoelectric layer and in various instances on the layer of interdigitated electrode is performed by spin coating.

According to an exemplary embodiment, the method further comprises, after the step of depositing the transparent dielectric layer, a step of patterning the transparent dielectric layer by photolithography.

The invention is particularly interesting in that the device of the invention shows an increased breakdown voltage and optionally an improved optical transparency in the visible range. Indeed, the dielectric layer on the transparent piezoelectric layer, bridging the interdigitated electrodes prevents electrical breakdown and thereby enables increasing the breakdown voltage of the piezoelectric device. It can also act as an optical index matching layer. The invention also shows the advantages of being easy to manufacture. The invention is particularly interesting in that the device of the invention can be used in many electronic applications such as actuators for haptic device, sensor.

DRAWINGS

FIG. 1 exemplarily represents a cross-sectional view of the piezoelectric device according to various embodiments of the invention.

Figure 2:
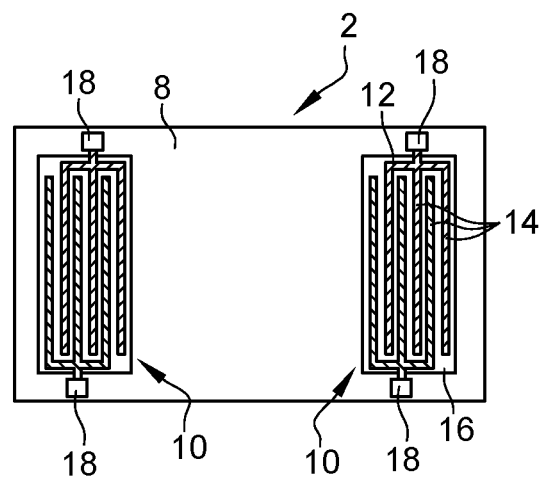

FIG. 2 exemplarily represents a top view of the device of the invention according to various embodiments of the invention.

Figure 3:
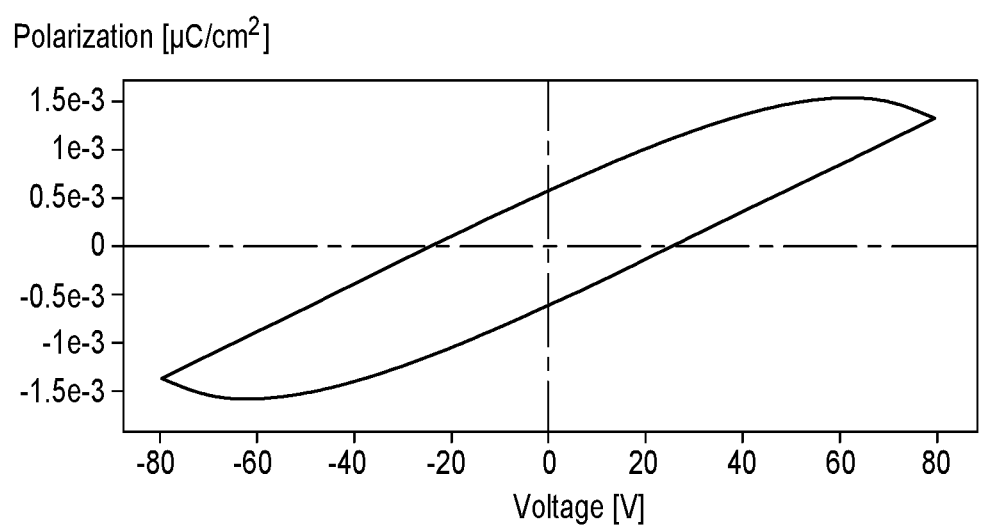

FIG. 3 exemplarily represents the polarization versus applied voltage measured on a piezoelectric device without the dielectric layer according to various embodiments of the invention.

FIG. 4 is a top-view optical microscope micrograph exemplarily showing degradation of ITO electrodes of a piezoelectric device without dielectric layer after applying voltage according to various embodiments of the invention.

FIG. 5 exemplarily represents the polarization versus applied voltage on the piezoelectric device of the invention according to various embodiments of the invention.

FIG. 6 is a top-view optical microscope micrograph exemplarily showing no degradation of ITO electrodes of a piezoelectric device of the invention according to various embodiments of the invention.

Figure 7:
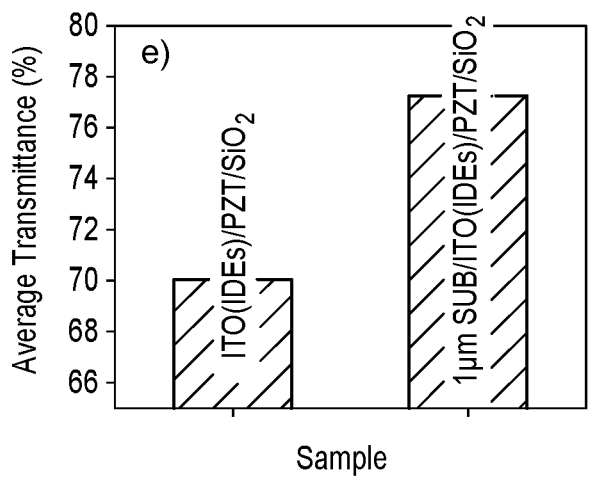

FIG. 7 exemplarily illustrates a comparison of the average transmittance of a piezoelectric device with and without the dielectric layer according to various embodiments of the invention.

Figure 8:
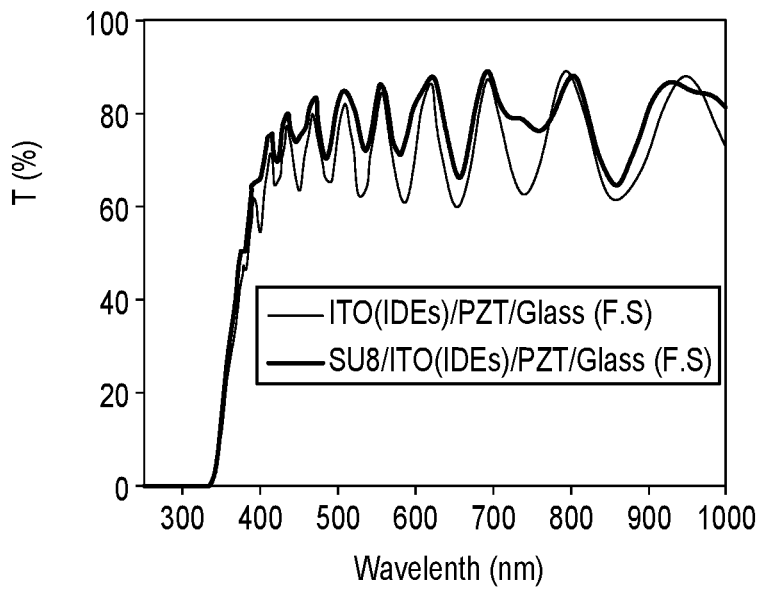

FIG. 8 exemplarily illustrates a transmission spectra in the UV-Visible range of a piezoelectric device with and without the dielectric layer according to various embodiments of the invention.

Figure 9:
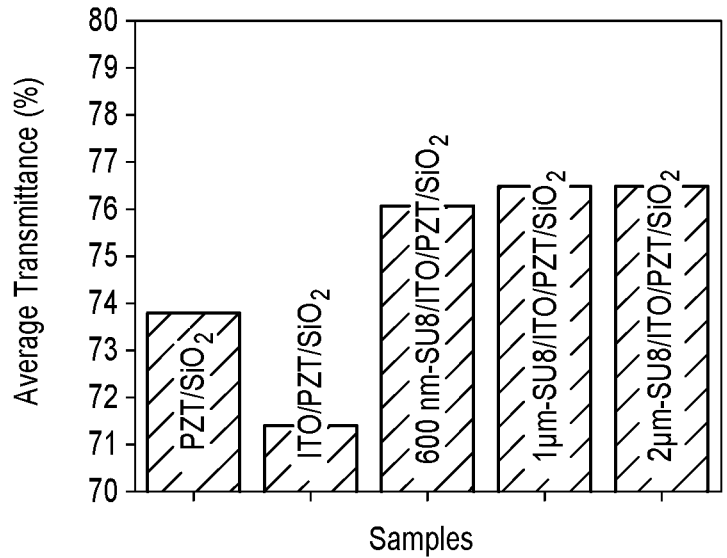

FIG. 9 exemplarily illustrates a comparison of the average transmittance on piezoelectric samples with the dielectric SU-8 of different thickness according to various embodiments of the invention.

DETAILED DESCRIPTION

In the following description the term "transparent" is used to mean that a material or a device transmits at least 70%, in various instances at least 80% of the incident visible light, i.e., in a wavelength range from 400 nm to 700 nm.

Structure of the Device

FIG. 1 and FIG. 2 respectively represents a cross-sectional view and a top view of a piezoelectric device 2 according to the invention. The piezoelectric device 2 comprises an optically transparent substrate 4. The substrate 4 can be made of any transparent material such as glass, for instance fused silica wafer. A transparent barrier layer 6 is on the substrate. The barrier layer can consist of ZrO2, MgO, $TiO_2$ or $HfO_2$. The barrier layer is a uniform deposited layer (deposition via ALD, sputtering, spinning or CSD solutions for example) or a continuous layer and in various instances covers 100% of the surface of the transparent substrate. The piezoelectric device 2 comprises a transparent piezoelectric layer 8 on the substrate, for instance directly on the transparent barrier layer 6. The piezoelectric layer 8 can be made of $Pb(Zr,Ti)O_3$ (PZT), $(K,Na)NbO_3$, $(Ba,Cr)(Zr,Ti)O_3$, $(Bi_{0.5}Na_{0.5})TiO_3$—$BaTiO_3$, Aluminium Nitride, Sc-doped aluminium nitride, $BiFeO_3$, La doped-$BiFeO_3$, Mn-doped $BiFeO_3$ or any combination thereof. The piezoelectric layer 8 can cover 100% of the surface of the transparent barrier layer 6. However, it is possible to pattern this piezoelectric layer by etching it with standard lithography techniques or directly during deposition by using for instance printing techniques such as inkjet printing, aerosol jet printing or screen printing.

The device 2 also comprises a transparent layer 10 of interdigitated electrodes 12 on the piezoelectric layer. The transparent layer 10 of interdigitated electrodes 12 consists of a conductive transparent material oxide such as indium tin oxide (ITO), Ga—In—Sn—O, Zn—In—Sn—O, Ga—In—O or Zn—In—O, Aluminium-doped ZnO, for example ITO. The transparent layer 10 of interdigitated electrodes 12 comprises one or more co-planar sets of interdigitated electrodes 12. Each set of interdigitated electrodes has two electrodes 12 and each electrode has a plurality of fingers 14 which are interdigitated.

The piezoelectric device 2 further comprises a transparent dielectric layer 16 on the transparent layer 10 of interdigitated electrodes 12. The transparent dielectric layer 16 has a refractive index inferior to the refractive index of the transparent layer of interdigitated electrodes and has a dielectric strength larger than 3 MV/m, in various instances larger than 100 MV/m, for example larger than 400 MV/m. The transparent dielectric layer 16 can consist of a Bisphenol A novolac epoxy also known as SU-8 (n=1.57, average for visible light) or can consist of other transparent dielectric materials such as silicon dioxide (n=1.45, average for visible light), silicon nitride (n=2.05, average for visible light), $SiO_xN_y$, alumina ($Al_2O_3$, n=1.76, average for visible light), hafnia ($HfO_2$, n=2.1, average for visible light), zirconia ($ZrO_2$, n=2.16, average for visible light) or parylene (n=1.66, average for visible light). The transparent dielectric 16 layer has a thickness lower than 200 μm, in various instances 2 μm and/or larger than 50 nm.

The transparent dielectric layer 16 covers at least the gap(s) between adjacent fingers 14, in various instances at least the entirety of the surface of the transparent layer 10 of interdigitated electrodes 12 as represented in FIGS. 1 and 2. According to an embodiment of the invention and as represented in FIGS. 1 and 2, the transparent layer 10 of interdigitated electrodes 12 covers partially the piezoelectric layer 8, in various instances at most all of the surface of the piezoelectric layer 8.

As this is apparent in FIG. 1, the dielectric layer 16 is on the transparent piezoelectric layer 8, between the interdigitated electrodes formed by the transparent layer 10. The dielectric layer 16 extends between adjacent fingers and bridges the fingers. This is a minimum requirement for increasing the breakdown voltage between the electrodes.

In FIGS. 1 and 2, the dielectric layer 16 covers the transparent layer 10 of interdigitated electrodes 12 and the piezoelectric layer 8 in between the electrodes. Away from the region where the interdigitated electrodes are, the dielectric layer leaves the remaining parts of the piezoelectric layer 8 free of the dielectric layer 16. Alternatively, the dielectric layer 16 can cover the piezoelectric layer 8. In this case, the refractive index of the transparent dielectric layer 16 is also inferior to the refractive index of the piezoelectric layer 8.

Note that having a transparent dielectric layer that is a photosensitive resist is advantageous because it can be directly patterned through standard lithography and does not need an extra etching step. This is for instance the case of any lithography resist. SU8 resist is of special interest because it is extremely transparent and after polymerization, it cannot be removed.

The piezoelectric device 2 further comprises contact pads 18, each contact pad 18 being connected to an electrode of the transparent layer of interdigitated electrodes. The contact pads 18 are free of the transparent dielectric layer, as represented in FIG. 2.

Example of Fabrication of the Piezoelectric Device

A fused silica wafer having thickness of 500 μm is used as transparent substrate. A 23 nm-thick $HfO_2$ layer is deposited on top of the fused silica wafer using an atomic layer deposition (ALD) reactor with tetrakis(ethylmethylamido) hafnium(IV) (TEMAHf) and deionized (DI) $H_2O$ as the precursors.

PZT solution with composition $Pb_{1.1}(Zr_{0.53}Ti_{0.47})O_3$ is prepared as follows. A solution comprising Titanium(IV) isopropoxide and zirconium(IV) propoxide is spin-coated on the substrate. Drying and pyrolysis are performed on a hot plate. Crystallization is performed in air atmosphere in rapid thermal annealing (RTA) furnace. The deposition-heating step can be repeated before crystallization. The whole deposition-heating-crystallization process is repeated several times to achieve the final thickness.

The interdigitated electrodes are patterned with lift-off photolithography using direct laser writing. Width of the fingers of the electrodes and gap between them are 10 μm. The 100 nm-thick indium tin oxide ($In2O_3/SnO_2$ 90/10 wt. %) is DC sputtered. Following the lift-off process the post-anneal is performed on a hot plate.

A dielectric layer of SU8 is deposited by spin coating method with the following protocol. SU8 2002 is diluted with SU8 2000 thinner in a 3:1 volume ratio. Deposition is performed by spin coating the photoresist on a PZT sample, followed by a pre-bake. The exposure is performed using direct writing with mask-less laser-writing system. A post-exposure bake can take place. Development is performed using SU8 developer. A hard bake is then performed on a hot plate.

Properties of the Device

FIG. 3 represents the polarization versus applied voltage measured on a piezoelectric device without dielectric layer. An AC voltage ranging from −80V to +80V at 100 Hz is applied to two interdigitated electrodes. As this is apparent, the curve show that the polarization increases with the positive voltage until about 60V and then progressively decreases from about 60V to 80V. The same applies to the negative voltage where the polarisation is negative.

FIG. 4 represents the top-view optical microscope micrograph showing degradation of the electrodes of the piezoelectric device without the dielectric layer, after application of the above AC voltage ranging from −100V to +100V, at 100 Hz.

FIG. 5 represents the polarization versus applied voltage on the device of the invention, i.e., with the dielectric layer of SU8. The voltage is an AC voltage from −400V to +400V at 100 Hz. As this is apparent, the resulting polarization reaches about 20 μC/cm² without breakdown, i.e., about $10^4$ time higher than without the dielectric layer, with reference to FIG. 3.

FIG. 6 is a top-view optical microscope micrograph of the piezoelectric device according to the invention comprising ITO electrodes and a SU8 dielectric layer. The image shows that after applying the AC voltage mentioned above in relation with FIG. 5 on the device, the device is not degraded.

FIG. 7 represents the average transmittance of two piezoelectric samples comprising a substrate of fused silica, a transparent layer of interdigitated electrodes of ITO, a layer of PZT and comprising or not a SU8 layer as the dielectric layer. The layer of SU8 is of 1 μm. The graphic clearly shows that the average transmittance of the piezoelectric device is increased when the device comprises a layer of SU8.

FIG. 8 represents the transmittance of the two samples in function of the wavelength. The results show that the layer of SU8 reduces the oscillations in transmission spectra. The dielectric layer therefore acts as an index matching layer and enhances the total transmittance of the whole device.

FIG. 9 represents a graphic of the average transmittance of different piezoelectric samples. The graphic show that the piezoelectric samples comprising a dielectric layer have a better transmittance than the two others piezoelectric devices ($PZT/SiO_2$ and $ITO/PZT/SiO_{20}$) not comprising a dielectric layer on top.

The increase of transmittance is the result of a refractive index matching. According to the Fresnel equations about the reflection and transmission of light, when normally incident on an interface between different optical media of refractive indexes $n_1$ and $n_2$, the reflectance of light R can be calculated as follows.

$$R = \left| \frac{n_1 - n_2}{n_1 + n_2} \right|^2$$

This means that the greater the difference between the refractive indexes $n_1$ and $n_2$, the greater the reflectance is and the lower the transmittance is. In the case of a multilayer substrate as in the present invention, it is advantageous to have, at each interface between different optical media, a limited difference of refractive indexes. For example, for a single interface between optical media with refractive indexes of 1 (e.g., air) and 2 (transparent material), the reflectance is of 11% and the transmittance is of 91% (1-reflectance) whereas for two superimposed interfaces between optical media with refractive indexes of 1, 1.5 and 2, the reflectance at the first interface (between the refractive indexes of 1 and 1.5) is of 4% and the reflectance at the second interface (between the refractive indexes of 1.5 and 2) is of 2%, resulting an in a total transmittance of 94.08%, which is more than for the single interface. This explains that in the present case, adding a layer of an appropriate refractive index increases the transmittance and thereby transparency of the device. Given the fact that the first optical medium is air (with a refractive index n=1) and that the piezoelectric layer shows a higher refractive index, e.g., of about 2.5, it is advantageous that the transparent dielectric layer shows a refractive index that is comprised between the refractive index of air and the refractive index of the transparent piezoelectric layer and even more advantageously comprised between the refractive index of air and the refractive index of the transparent conductive layer of interdigitated electrodes.

The results therefore show that the addition of the dielectric layer on the transparent layer of interdigitated electrodes improves two unrelated properties that are the dielectric strength of the structure and the optical transmittance.

What is claimed is:

1. A piezoelectric device, said device comprising:
   a transparent substrate;
   a transparent piezoelectric layer on the transparent substrate;
   a transparent conductive layer of interdigitated electrodes on the transparent piezoelectric layer; and
   a transparent dielectric layer directly on the transparent piezoelectric layer, contacting the interdigitated electrodes, and having a dielectric strength greater than 3 MV/m; and
   wherein at least one of the following holds true:
      the transparent dielectric layer has a refractive index, in a wavelength range from 400 nm to 700 nm, that is lower, within the wavelength range, than a refractive index in the wavelength range of the transparent piezoelectric layer; and
      the transparent dielectric layer covers the transparent conductive layer of interdigitated electrodes and has a refractive index, in a wavelength range from 400 nm to 700 nm, that is lower, within the wavelength range, than a refractive index in the wavelength range of the transparent conductive layer of interdigitated electrodes.

2. The piezoelectric device according to claim 1, wherein each electrode of the interdigitated electrodes comprises portions adjacent to corresponding portions of another electrode of the interdigitated electrodes, so as to form gaps between the portions and corresponding portions, the transparent dielectric layer extending between and bridging the interdigitated electrodes.

3. The piezoelectric device according to claim 1, wherein the transparent dielectric layer shows an average thickness between the interdigitated electrodes that is at least 80% of an average thickness of the interdigitated electrodes.

4. The piezoelectric device according to claim 1, wherein the refractive index of the transparent conductive layer of interdigitated electrodes is lower, over the wavelength range, than a refractive index in the wavelength range of the transparent piezoelectric layer.

5. The piezoelectric device according to claim 1, wherein the transparent dielectric layer has a thickness of at least one of less than 5 µm and greater than 0.2 µm.

6. The piezoelectric device according to claim 5, wherein the transparent dielectric layer has a thickness equal to 1 µm.

7. The piezoelectric device according to claim 1, wherein the transparent dielectric layer consists of a material selected from: bisphenol A novolac epoxy, silicon dioxide, silicon nitride, $SiO_xN_y$, alumina, hafnia, zirconia.

8. The piezoelectric device according to claim 1, wherein the transparent layer of interdigitated electrodes comprises two coplanar sets of interdigitated electrodes, each set being one electrode, each electrode having a plurality of fingers that are interdigitated.

9. The piezoelectric device according to claim 1, wherein the piezoelectric device further comprises pads, each pad being connected to an electrode of the transparent layer of interdigitated electrodes, the pads being free of the transparent dielectric layer.

10. The piezoelectric device according to claim 1, wherein the transparent layer of interdigitated electrodes consists of a conductive transparent oxide.

11. The piezoelectric device according to claim 10, wherein the conductive transparent oxide is one of indium-tin oxide (ITO) or fluorine-tin oxide (FTO) or aluminum-doped zinc oxide (AZO), Ga—In—Sn—O (GITO), Zn—In—Sn—O(ZITO), Ga—In—O (GIO), or Zn—In—O (ZIO).

12. The piezoelectric device according to claim 1, wherein a transparent barrier layer is applied between the transparent substrate and the transparent piezoelectric layer, the transparent barrier layer consisting of one of MgO; $TiO_2$, $HfO_2$; $ZrO_2$.

13. The piezoelectric device according to claim 1, wherein the transparent piezoelectric layer is made of at least one of $Pb(Zr,Ti)O_3$ (PZT), $(K,Na)NbO_3$, $(Ba,Cr)(Zr,Ti)O_3$, $(Bi_{0.5}Na_{0.5})TiO_3$—$BaTiO_3$, Aluminum Nitride, Sc-doped aluminum nitride, $BiFeO_3$, La doped-$BiFeO_3$, Mn-doped $BiFeO_3$.

14. The piezoelectric device according to claim 1, wherein the transparent piezoelectric layer has a surface representing 100% of the surface of the transparent substrate.

15. A method for fabricating a transparent piezoelectric device, said method comprising the following steps:
   providing a transparent substrate;
   depositing a transparent piezoelectric layer on the transparent substrate;
   depositing a transparent layer of interdigitated electrodes on the transparent piezoelectric layer; and depositing a transparent dielectric layer directly on the transparent piezoelectric layer, between and contacting the interdigitated electrodes, and having a dielectric strength superior to 3 MV/mm; and wherein at least one of the following holds true:
the transparent dielectric layer has a refractive index, in a wavelength range from 400 nm to 700 nm, that is lower, within the wavelength range, than a refractive index in the wavelength range of the transparent piezoelectric layer; and the transparent dielectric layer covers the transparent conductive layer of interdigitated electrodes and has a refractive index, in a wavelength range from 400 nm to 700 nm, that is lower, within the wavelength range, than a refractive index in the wavelength range of the transparent conductive layer of interdigitated electrodes.

16. The method according to claim 15, wherein the step of depositing the transparent dielectric layer on the transparent piezoelectric layer between the interdigitated electrodes is performed by spin coating.

17. The method according to claim 15, wherein the method further comprises, after the step of depositing the transparent dielectric layer, a step of patterning the transparent dielectric layer by photolithography.

* * * * *